(12) United States Patent
Chien et al.

(10) Patent No.: US 9,703,331 B1
(45) Date of Patent: Jul. 11, 2017

(54) BOARD FASTENER FOR SECURING A DATA STORAGE DEVICE IN AN INFORMATION HANDLING SYSTEM

(71) Applicant: Dell Products L.P., Round Rock, TX (US)

(72) Inventors: Tung Yu Chien, New Taipei (TW); Chi Chang Fu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/145,594

(22) Filed: May 3, 2016

(51) Int. Cl.
   *G06F 1/16* (2006.01)
   *G06F 1/18* (2006.01)
   *H05K 7/14* (2006.01)
   *G06F 13/40* (2006.01)

(52) U.S. Cl.
   CPC .............. *G06F 1/183* (2013.01); *G06F 1/16* (2013.01); *G06F 1/185* (2013.01); *G06F 1/186* (2013.01); *G06F 1/187* (2013.01); *G06F 13/409* (2013.01); *H05K 7/1404* (2013.01); *H05K 7/1405* (2013.01)

(58) Field of Classification Search
   CPC ........ G06F 1/185; G06F 1/186; G06F 13/409; G06F 1/183; G06F 1/187; G06F 1/16; H05K 7/1404; H05K 7/1405

USPC ............... 361/679.58, 717, 740, 748, 801
   See application file for complete search history.

(56) References Cited

U.S. PATENT DOCUMENTS

| | | | | |
|---|---|---|---|---|
| 4,644,614 A * | 2/1987 | Mizusawa | ............. | F16B 5/0607 174/138 D |
| 7,338,068 B2 * | 3/2008 | Kawai | ................... | B60R 21/215 24/297 |
| 8,579,645 B2 * | 11/2013 | Wang | ..................... | H01R 12/73 439/326 |
| 2011/0065291 A1 * | 3/2011 | Wei | ..................... | H01R 12/7005 439/62 |
| 2013/0058054 A1 * | 3/2013 | Zhou | ....................... | G06F 1/185 361/748 |

\* cited by examiner

*Primary Examiner* — James Wu
(74) *Attorney, Agent, or Firm* — Jackson Walker L.L.P.

(57) ABSTRACT

A board fastening apparatus includes an anchor and a key connected by a flexible tether. The anchor may include a pedestal and a collar. The pedestal may be configured to engage a free edge of a data storage board. The pedestal may define a channel for receiving a pin from the key. The collar may be configured to engage a via form in a mounting board or other substrate. The fastening device key may include a base, a pin, and a pull tab. The pin may be affixed to a first surface of the base and configured to insert into the channel defined by the pedestal. With the anchor affixed to the mounting board and the storage board's free edge engaged by the pedestal, inserting the pin into the channel places the base partially overlying the storage board to restrain movement of the free edge in the vertical direction.

20 Claims, 5 Drawing Sheets

BOARD FASTENER FOR SECURING A DATA STORAGE DEVICE IN AN INFORMATION HANDLING SYSTEM

TECHNICAL FIELD

The present disclosure relates to information handling systems. More specifically, disclosed embodiments provide systems and methods for securing a data storage device within an information handling.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems frequently include a motherboard on which one or more processors, e.g., central processing units (CPUs), general purpose microprocessors, etc., are attached. The motherboard generally includes one or more connectors for coupling one or more data storage devices to the one or more processors.

Increasingly, solid state drives (SSDs) are being employed to provide at least some portion of an information handling system's persistent storage capacity. Although more expensive per byte than magnetic hard disk drives (HDDs), SSDs provide substantially faster access times.

A widely utilized example of an SSD is a peripheral component interconnect express (PCIe) nonvolatile memory express (NVMe) SSD in an M.2-compliant form factor. M.2 is a specification for internally mounted expansion cards and the corresponding connectors. Unlike its predecessor, mSATA, M.2 permits modules of different widths and lengths. M.2 connectors can be configured to support PCIe, USB, and SATA interfaces.

An M.2-compliant printed circuit board (PCB), which may be referred to herein as an M.2 card, generally includes a semicircular notch, referred to herein as an engagement notch, formed in the "free" edge of the M.2 card, i.e., the edge opposite the card's connector contacts. The engagement notch is designed to accommodate a screw that retains the M.2 card in a stationary position once the M.2 card is attached to an M.2 connector.

While alternatives to conventional machine screws for use in securing M.2 cards have been described, proposed solutions may require more clearance or space than is available for a particular application or may employ a design that is sub-optimal in terms of its ability to "unlock" the card reliably over any extended period of time.

SUMMARY

In accordance with the teachings of the present disclosure, disadvantages and problems associated conventional M.2 fastening devices are addressed.

In accordance with embodiments of the present disclosure, a board fastening apparatus includes an anchor and a key that are connected by a flexible tether. The anchor may include a pedestal and a collar. The pedestal may be configured to engage a free edge of an M.2 card or other form of data storage board. The pedestal may define a channel for receiving a pin from the key. The collar may be configured to engage a via in a substrate, which may be a second PCB referred to herein as a mounting board.

The fastening device key may include a base, a pin, and a pull tab. The pin may be affixed to a first surface of the base and configured to insert into the channel defined by the anchor's pedestal. When the anchor is received in a mounting board via with the free edge of the data storage board engaged by the pedestal, insertion of the pin into the pedestal's channel places the base partially overlying the data storage board to prevent the free edge of the data storage board from being inadvertently displaced in a vertical direction, i.e., in a direction perpendicular to an upper surface of the mounting board.

The pull tab may be implemented as a ring attached to a tab body. The pull tab may include a folding element referred to herein as an elbow that couples the tab body to a second surface of the base. The elbow may be configured to transition freely through an angle of approximately 90 degrees from an open position to a closed position or vice versa. In the open position, a center line of the pull tab may be substantially in line with a central axis of the pin and the pull tab's ring may lie over the pin's central axis to facilitate removal of the pin from the channel. In the closed position of the elbow, the pull tab ring may lie in a "low profile" plane, substantially parallel to the mounting board upper surface. The low profile plane may lie below a plane defined by an upper surface of the data storage board when the free edge of the data storage board is properly engaged by the pedestal.

The anchor may include one or more fins attached a lower portion of the pedestal and configured to contact the mounting board upper surface when the anchor is engaged in the mounting board via. When in contact with the moutninb board upper surface, the fins may deflect to accommodate the mounting board while applying a lifting force to the pedestal. The collar may be segmented, comprising a plurality of collar segments, each of which may terminate at or otherwise include a termination flange configured to engage a lower surface of the mounting board when the collar is engaged in the mounting board via.

The tab body of the fastening device's key may define an opening and the key may include a tab latch affixed to the first surface of the base. The tab latch may be positioned and sized to extend through the opening and engage the tab ring to maintain the tab latch in the low profile plane when the elbow is in the closed position.

The pedestal may define an engagement structure for engaging a complementary engagement notch defined in the free edge of the data storage board. In the case of an M.2 form factor data storage board, the engagement notch may be a semicircular notch of a particular radius. The pedestal may include two or more tiers, including an upper tier that overlies a portion of a lower tier and defines the engagement structure as well as the channel. The data storage board may rest on exposed portions of the pedestal lower tier when the free edge of the data storage board is engaged by the pedestal.

In accordance with additional embodiments of the present disclosure, a data storage device may include a mounting board including a mounting board connector, a data storage board including a connector edge configured to connect to the mounting board connector and a free edge for engaging a board fastener. The board fastener may include a pull tab operable in an open position to facilitate removal of a pin from a channel defined by the board fastener's pedestal. The pull tab may accommodate a closed positioned in which a plane defined by a pull tab ring lies below an upper surface of the data storage board wherein the board fastener lies entirely below the surface of the data storage board and therefore imposes no additional z-axis or vertical clearance requirements.

In accordance with additional embodiments of the present disclosure, an information handling system includes a CPU and a data storage device coupled to a motherboard, where the data storage device comprises a first PCB including a connector, a solid state drive PCB including a connector edge configured to connect to the connector of the first PCB and a retention edge for engaging a board fastener that includes a pull tab. The pull tab is operable in an open position to facilitate removal of a pin from a channel defined by the board fastener's pedestal. The pull tab may also accommodate a closed positioned in which a plane defined by a pull tab ring lies below an upper surface of the solid state drive PCB wherein the board fastener lies entirely below the surface of the solid state drive and therefore imposes no additional z-axis or vertical clearance requirements.

Technical advantages of the present disclosure may be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-8, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network data storage device, or any other suitable device and may vary in size, shape, performance, functionality, and price. The information handling system may include memory, one or more processing resources such as a CPU or hardware or software control logic. Additional components of the information handling system may include one or more data storage devices, one or more communications ports for communicating with external devices as well as various input and output (I/O) devices, such as a keyboard, a mouse, and a video display. The information handling system may also include one or more busses operable to transmit communication between the various hardware components.

In this disclosure, the term "information handling resource" may broadly refer to any component system, device or apparatus of an information handling system, including without limitation processors, busses, memories, input-output devices and/or interfaces, storage resources, network interfaces, motherboards, electro-mechanical devices (e.g., fans), displays, and power supplies.

Figure 1:
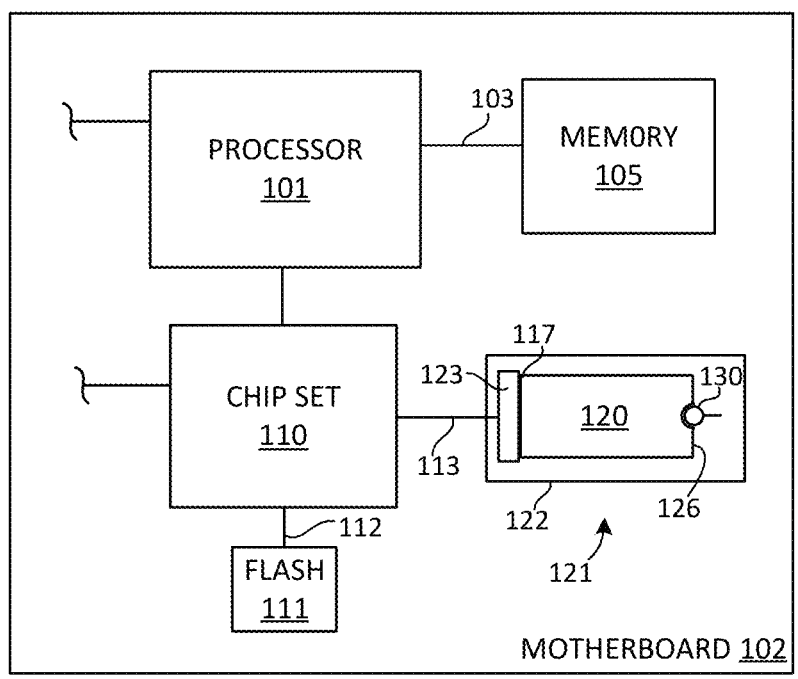
FIG. 1 illustrates a block diagram of an information handling system including a data storage device in accordance with disclosed subject matter.

FIG. 1 illustrates a block diagram of information handling system 100. The information handling system 100 illustrated in FIG. 1 includes a CPU 101, a memory 105, a chip set 110, flash 111, and a data storage device 121 affixed to a motherboard 102. The CPU 101 illustrated in FIG. 1 is coupled to a memory 105 via a memory bus 103. The memory 105 may include processor executable program instructions, data, or a combination thereof, used by CPU 101. The processor executable instructions in memory 105 may include an operating system and supporting drivers, application programs, and so forth. The CPU 101 is also coupled to a chip set 110. The chip set 110 of FIG. 1 is coupled to flash 111, which may contain basic input/output storage (BIOS) instructions accessible to CPU 101 via a low bandwidth bus 112 (e.g., I2C, SPI, etc.)

The chip set 110 is further coupled to a data storage device 121 by a peripheral bus 113. The data storage device 121 illustrated in FIG. 1 includes a data storage board 120 including a connector edge 117 connected to a mounting board connector 123 of a mounting board 122, also referred to herein as a substrate or substrate board. A free edge 126 of the data storage board 120 illustrated in FIG. 1 is engaged or restrained by a board fastener 130 in accordance with subject matter disclosed in the subsequent figures.

The information handling system 100 of FIG. 1 may represent any of a number of different types of information handling systems including, as non-limiting examples, a desktop computer, a laptop or notebook computer, an enterprise server computer, a database server, and so forth. In addition, it will be appreciated by those of ordinary skill in the art that the elements of information handling system 100 illustrated in FIG. 1 are representative and not inclusive of all elements of the information handling system 100.

Figure 2A:
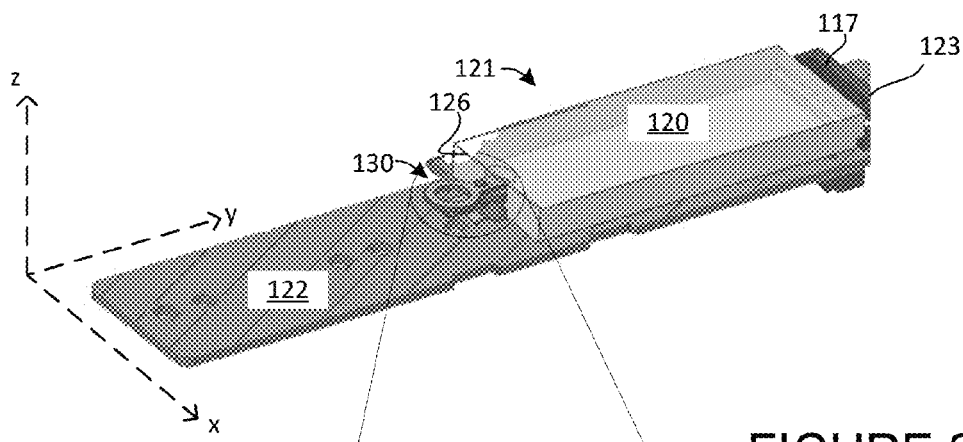
FIG. 2A illustrates a perspective view of a data storage device suitable for use in the information handling system of FIG. 1.

FIG. 2A is a perspective view of data storage device 121. The data storage device 121 illustrated in FIG. 2A includes data storage board 120, board fastener 130, and mounting board 122. Mounting board 122 may be implemented as a printed circuit board and may include a mounting board connector 123. Mounting board connector 123 may be configured to receive a connector edge 117 of data storage board 120. Data storage board 120, in at least one embodiment, may comprise an M.2 form factor PCB including at least one PCIe NVMe solid state drive attached and mounting board connector 123 is an M.2 connector.

Although connector edge 117 of data storage board 120 is connected to mounting board connector 123, the free end at an opposite end of data storage board 120, referred to herein as free edge 126, may be free to move about and thereby cause instability or a disconnection between data storage board 120 and mounting board connector 123.

The data storage device 121 illustrated in FIG. 2A includes a board fastener 130 to restrain free edge 126 when a connector edge 117 of data storage board 120 is received in mounting connector 123 and the free edge 126 of data storage board 120 is engaged by the board fastener 130. As described in greater detail with respect to FIG. 3 through FIG. 8, the board fastener 130 illustrated in FIG. 2A is illustrated in a closed position that conveys the ability of board fastener 130 to assume a "low profile. In at least one embodiment, the board fastener 130 imposes no additional clearance requirements for data storage device 121 in the vertical direction represented by the z-axis shown in FIG. 2A. In other words, the board fastener 130, when in the closed position, lies entirely below a plane defined by an upper surface of data storage board 120.

Figure 2B:
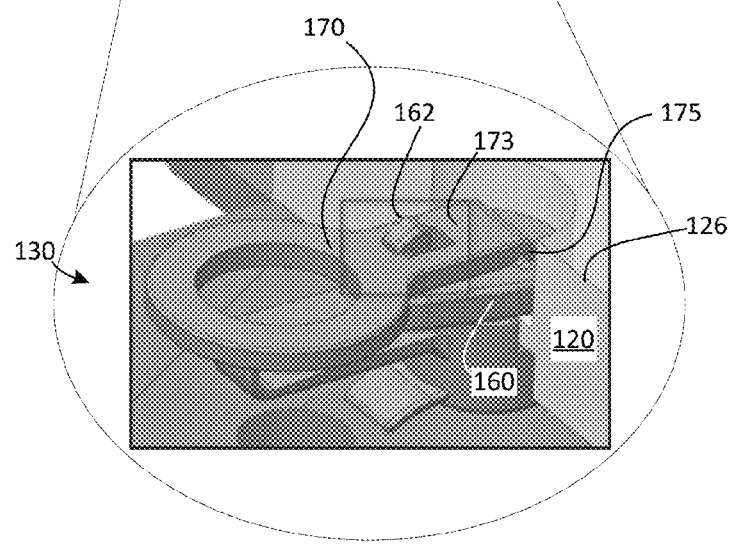
FIG. 2B depicts detail of a section of FIG. 2A illustrating a board fastener in accordance with disclosed subject matter.

FIG. 2B is a detail view of a section of FIG. 2A, illustrating greater detail of the board fastener 130. FIG. 2B illustrates a pull tab 170 of the board fastener 130 in a closed position in which a tab latch 162 extends through an opening formed in a body 173 of the pull tab 170 to retain the pull tab 170 in its closed position parallel to the data storage board 120. Pull tab 170 is connected through a foldable elbow 175 to a base piece 160 that resides over a portion of the data storage board 120 when data storage board 120 is received in a pedestal of board fastener 130. Thus, the board fastener 130 of FIG. 2B maintains data storage board 120 in an engaged position in which the free edge 126 of the data storage board 120 is encased by the pedestal and is not free to move in the z direction, being restrained by the base piece 160 of board fastener 130.

Figure 3:
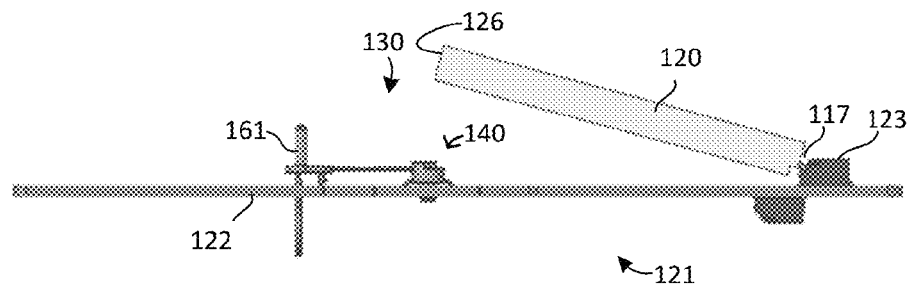
FIG. 3 illustrates a first stage of a process for connecting a data storage board to a substrate of a data storage device in conjunction with a disclosed board fastener.
Figure 4:
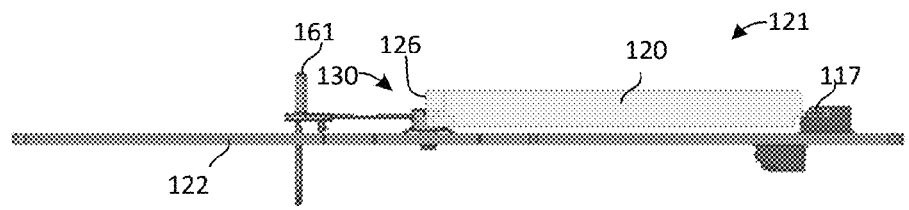
FIG. 4 illustrates a stage subsequent to FIG. 3 in which the data storage board is fastened to the substrate by a disclosed board fastener.
Figure 5:
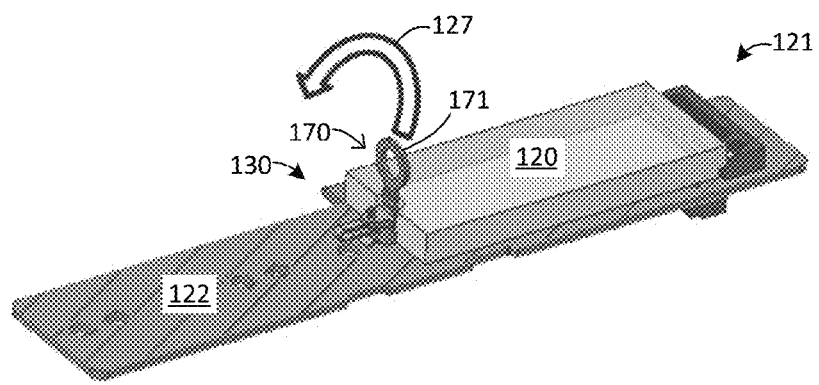
FIG. 5 illustrates a perspective view of the data storage board fastened to the substrate by a disclosed board fastener, which is illustrated in an open position suitable for unlocking the board fastener.

Referring now to FIG. 3, FIG. 4, and FIG. 5, the data storage board 120 is illustrated being inserted into the data storage device 121. In FIG. 3, data storage board 120 is maintained at a low angle relative to the mounting board 122. In this position, the connector edge 117 of data storage board 120 may inserted into the mounting board connector 123 of mounting board 122. The board fastener 130 has been inserted into an opening or via of substrate board 122 and, as illustrated in FIG. 3, the board fastener 130 is in its open position with its pin 161 detached from the anchor 140. As illustrated in FIG. 4, with the board fastener 130 in the open position, and the data storage board 120 inserted into mounting connector 123, the free edge 126 of data storage board 120 may be pushed downward until the free edge 126 is received in the anchor 140 of board fastener 130 as illustrated in FIG. 4.

With data storage board 120 seated in or engaged by board fastener 130, the board fastener 130 may be closed by inserting pin 161 into the anchor. FIG. 5 illustrates, in perspective view, the data storage device 121 after the board fastener 130 has been closed and the board fastener pin (no longer visible) has been inserted into the anchor of board fastener 130.

The board fastener 130 has not been fully closed in FIG. 5. The ring 171 of the pull tab 170 remains in a vertically oriented position. FIG. 5 illustrates, however, that the pull tab ring 171 may be pulled down as indicated by the motion indicator 127, to fully close board fastener 130 into its low-profile position. FIG. 5 also suggests, however, that in the depicted position, the pull tab ring 171 is oriented directly over the pin which has been inserted into the fastener pedestal. In this position, the pull tab ring 171 facilitates removal of pin from the pedestal.

Those of ordinary skill may recognize that the data storage device 121 illustrated in FIG. 3, FIG. 4, and FIG. 5, is consistent with an M.2 form factor data storage device.

Figure 6:
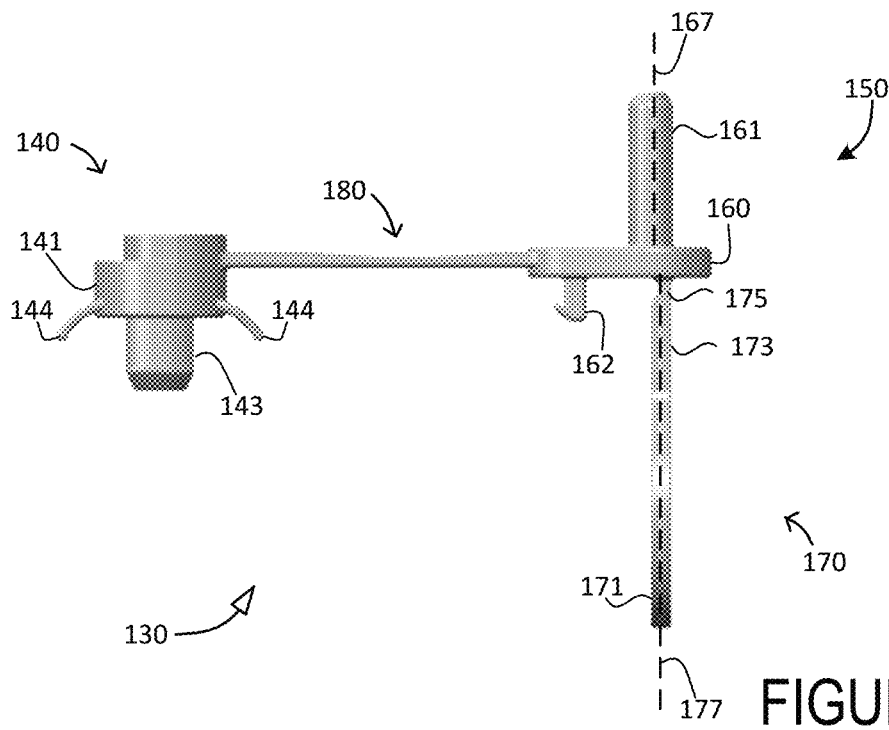
FIG. 6 is an elevation view of a disclosed board fastener.
Figure 7:
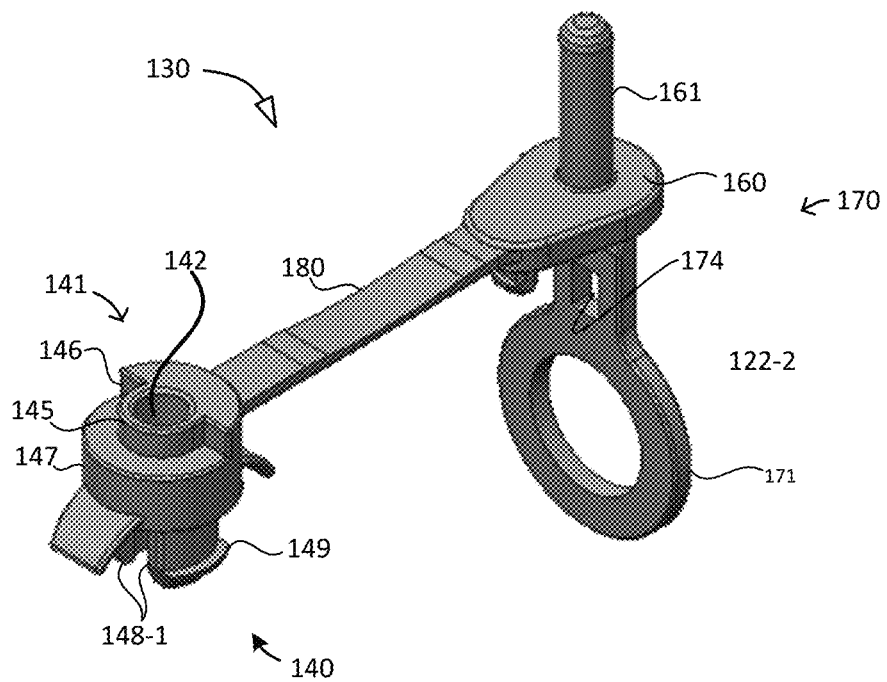
FIG. 7 is a perspective view of a disclosed board fastener.

Referring now to the FIG. 6 side elevation view of board fastener 130 and the FIG. 7 perspective view of board fastener 130, the illustrated board fastener 130 includes a key 150 connected to an anchor 140 by a flexible tether 180. The depicted anchor 140 includes a pedestal 141 and a collar 143 extending from a lower surface of pedestal 141. The anchor 140 shown in FIG. 6 and FIG. 7 further includes fins 144, attached to a lower portion of pedestal 141. The fins 144 are configured to contact an upper surface of a substrate to which anchor 140 is attached and to deflect as collar 143 is inserted through a via in the substrate apply such that fins 144 apply a lifting force to pedestal 141 with the collar engaged in the substrate via.

The pedestal 141 is configured to engage a free edge of a PCB including, as a non-limiting example, the free edge of an M.2 form factor data storage board that includes at least one PCIe NVMe SSD. The pedestal 141 of FIG. 6 and FIG. 7 defines a channel 142 for receiving a pin such as the pin 161 of key 150. The collar 143 is sized and otherwise configured to engage a via in a substrate.

The pedestal 141 of FIG. 6 and FIG. 7 defines an engagement structure 145 suitable for engaging a complementary engagement notch defined in the free edge of the data storage board 120. For M.2 form factor data storage boards 120 the storage card's engagement notch comprises a semicircle of a particular radius and, in these embodiments, pedestal 141 defines a semicircular engagement structure 145. The pedestal 141 may include an upper tier 146 overlying portions of a lower tier 147 wherein an outline of the upper tier 146 defines the engagement structure 145, and wherein the data storage board engages pedestal by resting on exposed portions of lower tier 147 with its engagement notch engaged by engagement structure 145.

The collar 143 of FIG. 6 may be implemented as a segmented collar including a plurality of collar segments 148. Each collar segment 148 may include a termination flange 149 configured to engage a lower surface of the substrate when the collar segments 148 are inserted through a substrate via. In some embodiments, the pedestal channel may extend downward through the collar segments 148. In these embodiments, the pin 161 may extend into or through the substrate via when the pin is inserted in the pedestal channel 141.

The key 150 illustrated in FIG. 6 and FIG. 7 includes a base 160 and the pin 161, affixed to a first surface of base 160, which must be configured for inserting in the channel 142 defined by pedestal 141. The key 150 shown in FIGURE and FIG. 7 includes a pull tab 170 comprising a ring 171 attached to a tab body 173. An elbow 175 couples tab body 173 to a second surface of base 160.

In at least one embodiment, elbow 175 may be repeatedly folded or bended through 90 degrees of rotation from a closed position at 0 through an open position at 90 degrees, which is the position illustrated in FIG. 6. In the open position, pull tab 170 is perpendicular or substantially perpendicular to the lower surface of base 160. When a free end of a data storage board is engaged in pedestal 141 and anchor 140 of board fastener 130 is engaged in a via of the substrate with pull tab 170 in the open position, the pull tab is also perpendicular or substantially perpendicular to the data storage board.

In the open position illustrated in FIG. 6, a center line 177 of the pull tab 170 is aligned or substantially aligned with a central axis 167 of pin 161. This alignment facilitates the use of pull tab 170 to remove pin 161 when pin 161 is inserted in pedestal channel 142. Particularly, the alignment or near alignment of pull tab center line 177 and pin central axis 167 results in no torque or substantially no torque applied to pin 161 during removal from pedestal channel 142. Instead, force applied to pull tab 170 provides a purely translational force to pin 161.

The elbow 175 of pull tab 170 enables pull tab 175 to rotate from the open position illustrated in FIG. 6 and FIG. 7 to a closed positioned with pull tab 170 to remove produces a and a closed position (not depicted in FIG. 6 or FIG. 7) in which a plane defined by ring 171 of pull tab 170 is parallel to or substantially parallel to a surface of lower surface of base 160.

The tab body 173 illustrated in FIG. 7 defines an opening 174 and the key 150 includes a tab latch 162 affixed to the second surface of base 160, i.e., the same surface of base 160 as the pull tab 170 attaches. The tab latch 162 of FIG. 7 is illustrated positioned and sized to extend through opening 174 and engage an upper surface of ring 171 to maintain the pull tab 170 in the closed position when desired.

The closed position has a beneficial and desirable low profile in which the entire board fastener 130 lies below a surface of the data storage board, thus ensuring that the data storage device 121 as a whole, will require no more z-axis clearance than is required for the data storage board itself. The low profile of board fastener 130 is best illustrated in FIGS. 2A and 2B and in the dual device assembly of FIG. 8 (see reference numeral 180-1 representing the extension of a plane defined by the upper or exposed surface of data storage board 120-1 and the corresponding reference numeral 180-2 representing the extension of the plane defined by the lower or exposed surface of data storage board 120-2).

Figure 8:
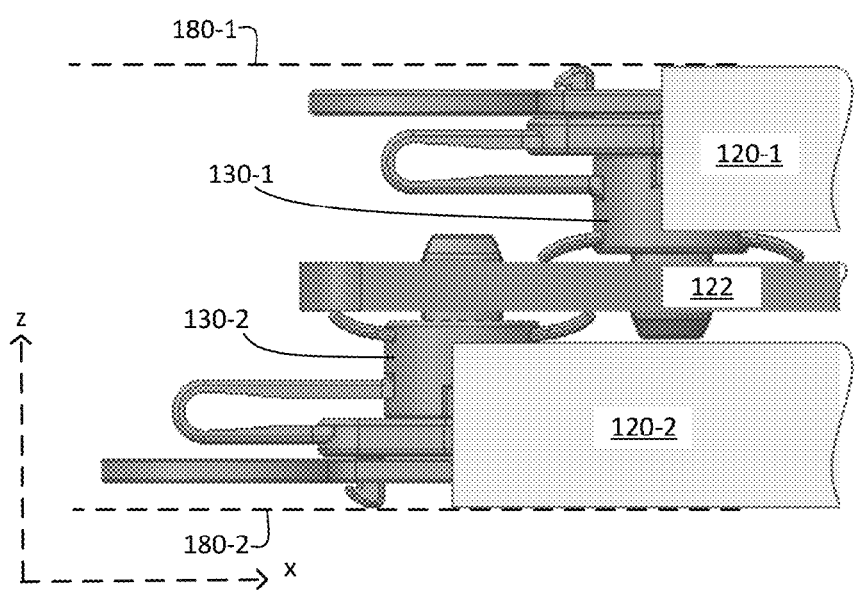
FIG. 8 is an elevation view of a dual device assembly that includes a pair of data storage boards affixed to opposing surfaces of a substrate by a pair of board fasteners in accordance with disclosed subject matter.

FIG. 8 illustrates an dual device assembly 181 in which a pair of data storage boards 120-1 and 120-2 are attached to opposite surfaces of a mounting board 122 with each data storage board 120 fastened to mounting board 122 by a corresponding board fastener 130 to achieve even higher storage density. FIG. 8 conveys that the z-axis profile of dual device assembly 181 is only slightly greater than the sum of the z-axis dimensions of a data storage boards 120-1 and 120-2 and mounting board 122 and that the small portion of the z-axis profile attributable to the storage board 122 is unaffected by the inclusion of a second data storage board. In this configuration, a comparatively small offset of the two data storage boards in an x-axis direction enables an doubling of storage with only a comparatively small increase in profile.

Although the present disclosure has been described in detail, it should be understood that various changes, substitutions, and alterations can be made hereto without departing from the spirit and the scope of the disclosure as defined by the appended claims.

What is claimed is:

1. A board fastening apparatus, comprising:
   an anchor, including:
      a pedestal configured to engage an edge of a printed circuit board, wherein the pedestal defines a channel for receiving a pin; and
      a collar configured to engage a via in a substrate;
   a key, including:
      a base;
      the pin, affixed to a first surface of the base, for inserting in the channel;
      a pull tab comprising a ring attached to a tab body; and
      an elbow coupling the tab body to a second surface of the base wherein the elbow includes:
         an open position, in which a center line of the pull tab is substantially in line with a central axis of the pin to facilitate removal of the pin from the channel; and
         a closed position in which the pull tab ring lies in a low profile plane substantially perpendicular to the central axis of the pin and substantially parallel to the substrate; and
   a tether connecting the key to the anchor.

2. The apparatus of claim 1, wherein the low profile plane lies below an upper surface of the printed circuit board engaged in the pedestal.

3. The apparatus of claim 1, wherein the anchor includes fins, attached to the pedestal, configured to contact the substrate and apply a lifting force to the pedestal with the collar engaged in the substrate via.

4. The apparatus of claim 1, wherein the collar comprises a segmented collar including a plurality of collar segments.

5. The apparatus of claim 1, wherein each collar segment terminates includes a termination flange configured to engage a lower surface of the substrate.

6. The apparatus of claim 1, wherein the tab body defines an opening and wherein the key includes a tab latch affixed to the first surface of the base, wherein the tab latch is configured to extend through the opening and engage the tab latch to maintain the tab latch in the low profile plane.

7. The apparatus of claim 1, wherein the pedestal defines an engagement structure and wherein the engagement structure engages an engagement notch defined in the edge of the printed circuit board.

8. The apparatus of claim 7, wherein the engagement notch comprises a semicircle of a particular radius.

9. The apparatus of claim 1, wherein the pedestal includes an upper tier overlying a portion of a lower tier wherein the upper tier defines the engagement structure, and wherein the printed circuit board rests on exposed portions of the lower tier when engaged.

10. A data storage device comprising:
    a substrate including a connector;
    a solid state drive board including a connector edge configured to connect to the connector and a retention edge;
    a board fastening apparatus, comprising:
       an anchor, including:

a pedestal configured to engage the retention edge of the solid state driver board, wherein the pedestal defines a channel for receiving a pin; and
a collar configured to engage a via in a substrate;
a key, including:
a base;
the pin, affixed to a first surface of the base, for inserting in the channel;
a pull tab comprising a ring attached to a tab body; and
an elbow coupling the tab body to a second surface of the base wherein the elbow includes:
an open position, in which a center line of the pull tab is substantially in line with a central axis of the pin to facilitate removal of the pin from the channel; and
a closed position in which the pull tab ring lies in a low profile plane substantially perpendicular to the central axis of the pin and substantially parallel to the substrate; and
a tether connecting the key to the anchor.

11. The data storage device of claim 10, wherein the low profile plane lies below an upper surface of the printed circuit board engaged in the pedestal.

12. The data storage device of claim 10, wherein the anchor includes fins, attached to the pedestal, configured to contact the substrate and apply a lifting force to the pedestal with the collar engaged in the substrate via.

13. The data storage device of claim 10, wherein the collar comprises a segmented collar including a plurality of collar segments.

14. The data storage device of claim 10, wherein each collar segment terminates includes a termination flange configured to engage a lower surface of the substrate.

15. The data storage device of claim 10, wherein the tab body defines an opening and wherein the key includes a tab latch affixed to the first surface of the base, wherein the tab latch is configured to extend through the opening and engage the tab latch to maintain the tab latch in the low profile plane.

16. An information handling system, comprising:
a central processing unit (CPU);
a data storage device coupled to the CPU, wherein the CPU comprising:
a substrate including a connector;
a solid state drive board including a connector edge configured to connect to the connector and a retention edge;
a board fastening apparatus, comprising:
an anchor, including:
a pedestal configured to engage the retention edge of the solid state driver board, wherein the pedestal defines a channel for receiving a pin; and
a collar configured to engage a via in a substrate;
a key, including:
a base;
the pin, affixed to a first surface of the base, for inserting in the channel;
a pull tab comprising a ring attached to a tab body; and
an elbow coupling the tab body to a second surface of the base wherein the elbow includes:
an open position, in which a center line of the pull tab is substantially in line with a central axis of the pin to facilitate removal of the pin from the channel; and
a closed position in which the pull tab ring lies in a low profile plane lying below an upper surface of the printed circuit board engaged in the pedestal substantially perpendicular to the central axis of the pin and substantially parallel to the substrate; and
a tether connecting the key to the anchor.

17. The data storage device of claim 16, wherein the anchor includes fins, attached to the pedestal, configured to contact the substrate and apply a lifting force to the pedestal with the collar engaged in the substrate via.

18. The data storage device of claim 16, wherein the collar comprises a segmented collar including a plurality of collar segments, wherein each collar segment terminates in a termination flange configured to engage a lower surface of the substrate.

19. The data storage device of claim 16, wherein the tab body defines an opening and wherein the key includes a tab latch affixed to the first surface of the base, wherein the tab latch is configured to extend through the opening and engage the tab latch to maintain the tab latch in the low profile plane.

20. The data storage device of claim 16, wherein the solid state drive board comprises an M.2-compliant form factor.

* * * * *

UNITED STATES PATENT AND TRADEMARK OFFICE
CERTIFICATE OF CORRECTION

PATENT NO. : 9,703,331 B1
APPLICATION NO. : 15/145594
DATED : July 11, 2017
INVENTOR(S) : Chien et al.

Page 1 of 2

It is certified that error appears in the above-identified patent and that said Letters Patent is hereby corrected as shown below:

In the Claims

Column 8, Lines 42-44, (approx.):
Please amend Claim 5 as follows:
5. The apparatus of claim 1, wherein each collar segment includes a termination flange configured to engage a lower surface of the substrate.

Column 9, Lines 32-34, (approx.):
Please amend Claim 14 as follows:
14. The data storage device of claim 10, wherein each collar segment includes a termination flange configured to engage a lower surface of the substrate.

Column 9, Line 40-Column 10, Line 28, (approx.):
Please amend Claim 16 as follows:
16. An information handling system, comprising:
    a central processing unit (CPU);
    a data storage device coupled to the CPU, wherein the CPU comprises:
    a substrate including a connector;
    a solid state drive board including a connector edge configured to connect to the connector and a retention edge;
    a board fastening apparatus, comprising:
        an anchor, including:
        a pedestal configured to engage the retention edge of the solid state driver board, wherein the pedestal defines a channel for receiving a pin; and
        a collar configured to engage a via in a substrate;
    a key, including:
        a base;
        the pin, affixed to a first surface of the base, for inserting in the channel;
        a pull tab comprising a ring attached to a tab body; and Signed and Sealed this
Second Day of October, 2018

Andrei Iancu
*Director of the United States Patent and Trademark Office* an elbow coupling the tab body to a second surface of the base wherein the elbow includes:

an open position, in which a center line of the pull tab is substantially in line with a central axis of the pin to facilitate removal of the pin from the channel; and a closed position in which the pull tab ring lies in a low profile plane lying below an upper surface of the printed circuit board engaged in the pedestal substantially perpendicular to the central axis of the pin and substantially parallel to the substrate; and a tether connecting the key to the anchor.

Column 10, Lines 29-44, (approx.):
Please amend Claim 17 as follows:
17. The information handling system of claim 16, wherein the anchor includes fins, attached to the pedestal, configured to contact the substrate and apply a lifting force to the pedestal with the collar engaged in the substrate via.

Please amend Claim 18 as follows:
18. The information handling system of claim 16, wherein the collar comprises a segmented collar including a plurality of collar segments, wherein each collar segment terminates in a termination flange configured to engage a lower surface of the substrate.

Please amend Claim 19 as follows:
19. The information handling system of claim 16, wherein the tab body defines an opening and wherein the key includes a tab latch affixed to the first surface of the base, wherein the tab latch is configured to extend through the opening and engage the tab latch to maintain the tab latch in the low profile plane.

Please amend Claim 20 as follows:
20. The information handling system of claim 16, wherein the solid state drive board comprises an M.2-compliant form factor.